United States Patent [19]
Bohler et al.

[11] Patent Number: 5,394,100
[45] Date of Patent: Feb. 28, 1995

[54] PROBE SYSTEM WITH AUTOMATIC CONTROL OF CONTACT PRESSURE AND PROBE ALIGNMENT

[75] Inventors: Walter Bohler, Stowe; Robert H. Macklin, Richmond; Thomas M. Price, Jericho; Seth A. Wright, Essex Jct., all of Vt.; Ralf Suss, Munich, Germany

[73] Assignee: Karl Suss America, Incorporated, Waterbury Center, Vt.

[21] Appl. No.: 58,573

[22] Filed: May 6, 1993

[51] Int. Cl.$^6$ .............................................. G01R 31/02
[52] U.S. Cl. ..................................... 324/758; 356/3; 324/757
[58] Field of Search ............... 348/135, 136, 137, 138, 348/139, 140, 141, 142; 359/372; 324/158 P, 158 F, 757, 758; 358/107; 382/8; 356/3

[56] References Cited

U.S. PATENT DOCUMENTS

| | | | |
|---|---|---|---|
| Re. 33,883 | 4/1992 | Ledley | 359/372 |
| 4,470,074 | 9/1984 | Yamada | 358/287 |
| 4,677,474 | 6/1987 | Sato | 324/158 P |
| 4,786,867 | 11/1988 | Yamatsu | 348/141 |
| 4,920,374 | 4/1990 | Sacks | 348/136 |
| 4,929,893 | 5/1990 | Sato et al. | 324/158 |
| 4,938,600 | 7/1990 | Into | 356/401 |
| 5,091,692 | 2/1992 | Ohno | 324/158 F |

Primary Examiner—Kenneth A. Wieder
Assistant Examiner—Mark Wardas
Attorney, Agent, or Firm—Perman & Green

[57] ABSTRACT

A probe system for probing a device under test (DUT) includes a DUT support chuck for holding the DUT. A plurality of flexible probe needles are positioned along a "Z" axis that extends orthogonally from the surface of the DUT. Each probe needle is movable with respect to the DUT support chuck. A motor provides for relative movement, at least along the Z axis, between the probe needles and the DUT support chuck. A variable focus imaging system is positioned along the Z axis and provides image signals to a control processor. The control processor causes the variable focus imaging system to image the surface of the DUT and at least one probe needle. The control processor is responsive to a determined distance between focal planes containing the DUT surface and probe needle to cause the motor to move the probe needle and the DUT surface into physical engagement. The motor is further controlled to provide a relative movement distance between the probe needle and the DUT that is greater than the determined distance between the focal planes, thereby enabling a predetermined contact pressure to be obtained.

8 Claims, 2 Drawing Sheets

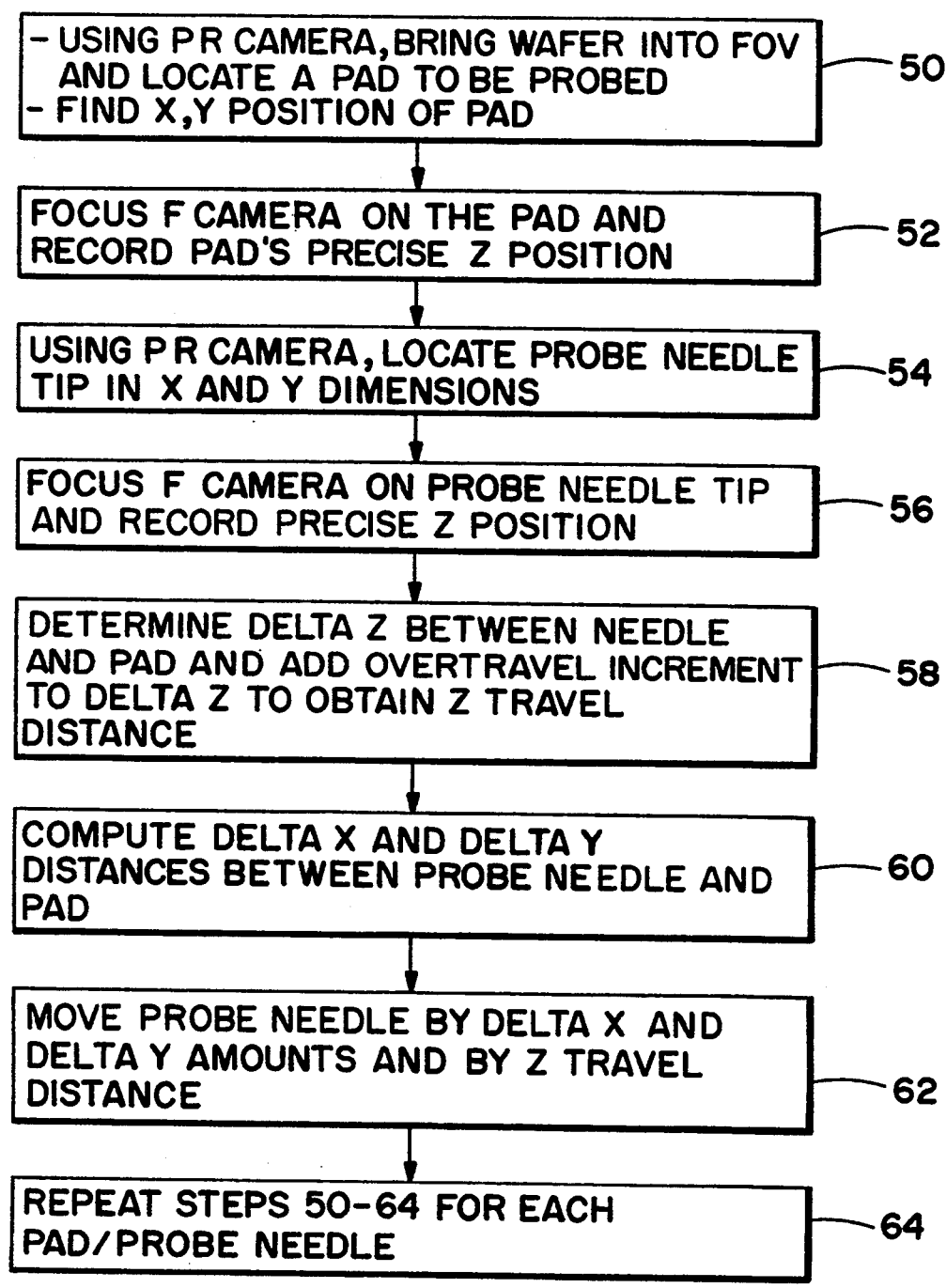

PROBE SYSTEM WITH AUTOMATIC CONTROL OF CONTACT PRESSURE AND PROBE ALIGNMENT

FIELD OF THE INVENTION

This invention relates to semiconductor probe systems, and more particularly, to an apparatus and method for automatically controlling contact pressure between a needle probe and a device under test.

BACKGROUND OF THE INVENTION

Probe systems are employed to enable computer-controlled circuit testers to exercise various portions of circuitry contained within a device under test (DUT). A critical feature of a probe system is an ability to accurately position needle probes in contact with pads on the DUT, with sufficient contact pressure to assure a reliable electrical connection. In earliest probe systems, a probe card was set in place over a DUT in the view field of a stereo microscope. An operator observed the probe needle tips and controlled movable stages to bring both the DUT and probe needle tips into contact. Later wafer probe systems incorporated automatic needle tip/wafer alignment systems that employed image recognition cameras.

A probe system, in addition to assuring proper registration between probe tips and contact pads on a DUT, must control contact pressure between the contact pads and probe tips. If too little pressure is exerted, a high resistance connection may occur. If too much pressure is exerted, the wafer pad and/or probe tip may be damaged.

In U.S. Pat. No. 4,929,893 to Sato et al., a probe system is described which employs a piezoelectric touch plate to determine the height (i.e., along a Z axis) of a group of probe tips in relation to a DUT support. Sato et al. employ a plurality of cameras to image various aspects of the probe tips and a DUT to enable X,Y dimension registration therebetween. Such imaging occurs from cameras positioned at disparate locations within the probe system and requires precise knowledge of the relative locations of the cameras. The probe tips and DUT are moved into registration subsequent to imaging.

Such image recognition systems are also employed to assure registration of layers of a semiconductor wafer (see U.S. Pat. No. 4,938,600 to Into).

It is an object of this invention to provide an improved probe system which employs only the same electronically controllable, imaging system to view both a DUT and a set of probe needles.

It is another object of this invention to provide an improved probe system wherein plural imaging cameras employ the same objective lens.

It is yet another object of this invention to provide an improved probe system wherein positions of both a DUT and needle probes are determined by a single imaging apparatus that enables probe contact pressures to be precisely controlled.

SUMMARY OF THE INVENTION

A probe system for probing a device under test (DUT) includes a DUT support chuck for holding the DUT. A plurality of flexible probe needles are positioned along a "Z" axis that extends orthogonally from the surface of the DUT. Each probe needle is movable with respect to the DUT support chuck. A motor provides for relative movement, at least along the Z axis, between the probe needles and the DUT support chuck. A variable focus imaging system is positioned along the Z axis and provides image signals to a control processor. The control processor causes the variable focus imaging system to image the surface of the DUT and at least one probe needle. The control processor is responsive to a determined distance between focal planes containing the DUT surface and probe needle to cause the motor to move the probe needle and the DUT surface into physical engagement. The motor is further controlled to provide a relative movement distance between the probe needle and the DUT that is greater than the determined distance between the focal planes, thereby enabling a predetermined contact pressure to be obtained.

DESCRIPTION OF THE DRAWINGS

FIG. 2 is a logical flow diagram helpful in understanding the operation of the system of FIG. 1.

DETAILED DESCRIPTION OF THE INVENTION

Figure 1:
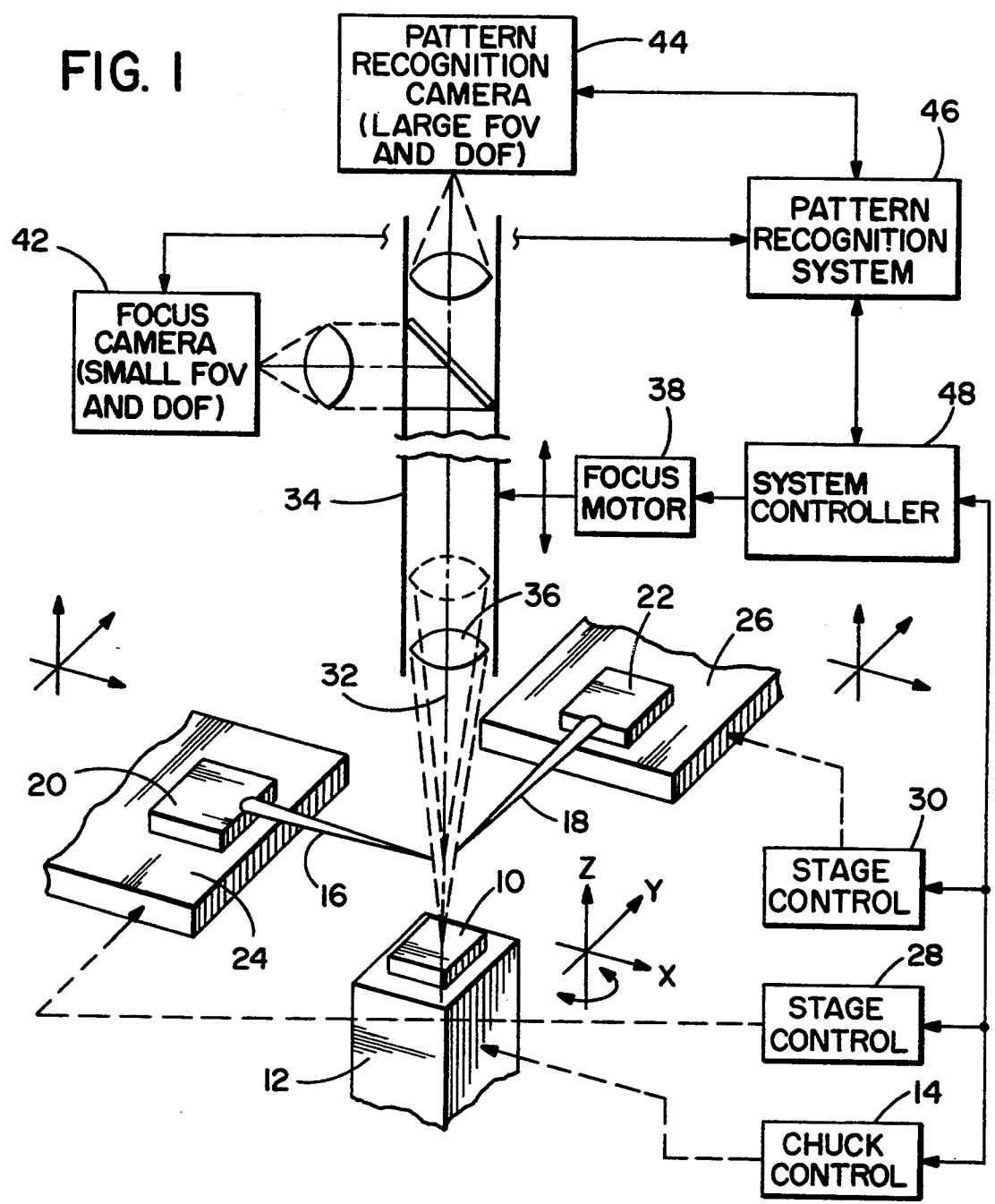
FIG. 1 is a schematic view of a system incorporating the invention.

Referring to FIG. 1, a DUT 10 has been emplaced upon a device chuck 12. DUT 10 may be a semiconductor wafer or chip having conductive pads that enable electrical access to internal active circuits. While not shown, DUT 10 is preferably held in a fixture which is, in turn, precisely positioned by a robot onto the upper surface of DUT chuck 12. A chuck control 14 controls movement mechanisms associated with DUT chuck 12 that enable translational movement of DUT 10 in both the X, Y, and Z dimensions, as well as rotation about the Z axis.

A pair of probe needles 16 and 18 are positioned above the uppermost surface of DUT 10 and extend from probe supports 20, 22 and probe stages 24, 26, respectively. Each of probe stages 24 and 26 is motor controlled and is translatable in the X, Y, and Z dimensions by respectively connected, stage control modules 28 and 30.

DUT chuck 12, DUT 10 and needle probe tips 16, 18 are all displaced along a Z-axis 32 that further defines the optical centerline of a microscope 34. An objective lens 36 is motor driven by a focus motor 38 so as to enable movement of the focal plane of microscope 34 vertically along Z-axis 32. While objective lens 36 is illustrated as a single lens, those skilled in the art will understand that a set of lenses may also serve as objective lens 36. Further, it is important to understand that all imaging of this invention takes place through objective lens 36, thus obviating the need for a mechanically rotatable set of variable magnification objective lenses.

A prism (or half silvered mirror) 40 is positioned within microscope 34 and directs image light from objective lens 36 to both a focus camera 42 and a pattern recognition camera 44. Focus camera 42 exhibits a narrow depth of field (DOF), e.g., 7–8 microns, and a small field of view (FOV), e.g., 1 mm. Focus camera 42 preferably employs a charge coupled device (CCD) imager with internal optics that enable a relatively large magnification factor. By contrast, pattern recognition camera 44 exhibits a larger FOV (e.g. 2 mm) and a large DOF (e.g. 20 microns). Pattern recognition camera 44 also preferably employs a CCD imager and exhibits a smaller degree of magnification than focus camera 42.

Cameras 42 and 44 provide inputs to a pattern recognition system 46 that enables imaged features to be identified and located within the FOV of either camera. Such a pattern recognition system is commercially available and a preferred model is the Cognex 3000, from the Cognex Corporation, (insert remainder of address). The Cognex 3000 is a processor-controlled, pattern recognition system that provides pattern data and autofocus inputs to a system controller 48. System controller 48 is preferably a personal computer sized data processing system.

Not shown in FIG. 1 are the electrical circuits connected to needle probes 16 and 18 that enable electrical stimulation to be applied to selected pads on the surface of DUT 10. Furthermore, the specific mechanisms that the control the positions of DUT chuck 12, and stages 24 and 26 have been excluded to avoid over complication of the view.

The system of FIG. 1 enables the upper surface of DUT 10 and the tips of probe needles 16 and 18 to be electronically imaged through a single objective lens 36. A Z-axis distance is then determined between a focal plane that encompasses the uppermost surface of DUT 10 and a focal plane that encompasses a tip of a probe needle 16 or 18. The Z-axis determined distance is added to an over-travel distance, with the sum being used to actuate a stage control (28 or 30) to move a probe needle (16 or 18) into contact with DUT 10 and to achieve a desired contact pressure. The detailed operation of FIG. 1 will be better understood from the following description of FIG. 2.

Initially, DUT 10 is placed on DUT chuck 12 by a robot (not shown). Chuck control 14 then brings DUT 10 into the FOV of pattern recognition camera 44. The approximate location of the pad to be imaged on the surface of DUT 10 is preprogrammed into system controller 48, allowing DUT 10 to be moved in the X, Y, and Z dimensions by chuck control 14. At this point (box 50) pattern recognition camera 44 images the upper surface of DUT 10 and locates the conductive pad thereon that is to be probed.

In order to enable pattern recognition camera 44 to move its focal plane to the upper surface of DUT 10, pattern recognition system 46, through system controller 48, causes focus motor 38 to move objective lens 36 until a proper level of focus is sensed. Similarly, when focus camera 42 comes into play, focus motor 38 is controlled to move the focal plane of the image presented to focus camera 42 until a properly focussed image is determined by pattern recognition system 46, at which point further movement of objective lens 36 by focus motor 30 ceases.

The X and Y dimension positions of the pad to be probed are found by pattern recognition system 46 from the image provided by pattern recognition camera 44 and are fed to system controller 48 where they are stored. Focus camera 42 is now controlled to shift its focal plane to the located pad. This shift of focal plane is accomplished by focus motor 38 causing an appropriate shift in position of objective lens 36, using the Z dimensions of the DOF obtained from pattern recognition camera 44. Pattern recognition system 46 then controls focus camera 42 to bring the uppermost surface of the imaged pad into precise focus within the small DOF of focus camera 42. This action locates the precise Z-axis position of the uppermost surface of the pad, which position is fed by pattern recognition system 46 to system controller 48 (box 52).

Pattern recognition camera 44 is now focussed on a probe needle tip (e.g. either the tip of probe needle 16 or probe needle 18) and determines the tip's X and Y dimension locations (box 54). The Z axis DOF limits of pattern recognition camera 44 are then fed by pattern recognition system 46 to system controller 48. Those Z axis limits are used to operate focus motor 30 to cause objective lens 36 to bring the focal plane of focus camera 42 into coincidence with the chosen probe needle tip.

Those skilled in the art will realize that once pattern recognition camera 44 has determined the X, Y position of a needle tip, the Z axis position of the needle tip is approximately known within the DOF of camera 44. Using that information, the focal plane of focus camera 42 is moved by focus motor 30 so as to more precisely locate the Z-axis location of the tip. The larger magnification of focus camera 42 enables an extremely accurate Z-axis position to be determined for the probe needle tip by pattern recognition system 46. The Z axis tip position is subsequently fed to system controller 48 (box 56).

System controller 48, now having Z-axis positions of the upper surface of DUT 10 and a probe tip, calculates a delta Z distance value between the probe tip and pad and adds an over-travel increment thereto. In this manner, a Z-Travel distance value is obtained (box 58). The over-travel increment is a z-axis distance that, given the known flexibility of a probe needle, enables a desired level of contact pressure to be obtained between the tip and a pad.

System controller 48 next computes delta X and delta Y distances between the probe needle tip and the pad (box 60) and then causes a stage control (e.g. stage control 30) to move the respectively connected probe needle (e.g. 18) by the delta X and delta Y amounts and the by the Z-Travel distance value (box 62). As a result, the tip of probe needle 18 contacts an imaged pad on the upper surface of DUT 10, in preparation for electrical stimulation thereof. The process is then repeated for probe needle 16 (box 64), at which point appropriate electrical stimuli is applied between probe needles 16 and 18 to enable testing of the circuitry within DUT 10.

Figure 3:
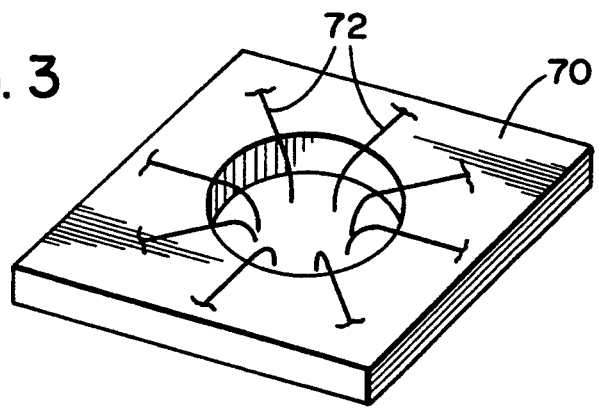
FIG. 3 shows a group of probe needles that extend from a probe support and are movable as a unit.

While probe stages 24 and 26 are shown as separately movable entities, a single card 70 with multiple probe needles 72 (see FIG. 3) may be moved into simultaneous contact with a plurality of pads on DUT 10. Under such conditions, only one stage control would be used to control the X, Y and Z movements of the connected probe card stage.

It should be understood that the foregoing description is only illustrative of the invention. Various alternatives and modifications can be devised by those skilled in the art without departing from the invention. For instance, while less preferred than the embodiment shown in FIG. 1, the imaging system may use, in lieu of two imaging cameras, (1) a single camera with a motor operated zoom lens that enables automatic adjustment of DOF and FOV, or (2) a single focus camera in combination with multiple objective lenses mounted on a motor driven objective revolver. Accordingly, the present invention is intended to embrace all such alternatives, modifications and variances which fall within the scope of the appended claims.

What is claimed is:

1. A probe system for probing a device under test (DUT) comprising:

DUT support means;

a plurality of probe needles, each said probe needle movable with respect to said DUT support means, said probe needles positioned adjacent a surface of a said DUT and along a Z-dimension axis that extends orthogonally from said surface;

motor means for providing relative movement at least along said Z axis between each said probe needle and said DUT support means;

variable focus imaging means positioned along said Z axis; and control means for causing said variable focus imaging means to provide images of both said surface of said DUT and at least a said probe needle, said control means responsive to a determined distance between focal planes of said images to cause said motor means to move said probe needle and said DUT surface into physical engagement, said motor means controlled to provide a distance of relative movement between said probe needle and said DUT surface that is greater than said determined distance between focal planes of said images, thereby creating a predetermined contact pressure between said probe needle and said DUT surface.

2. The probe system as recited in claim 1 wherein said variable focus imaging means comprises:

a microscope column including objective lens means, said objective lens means being movable along said Z-axis;

a focus camera positioned to image light passing through said objective lens; and a pattern recognition camera also positioned to image light passing through said objective lens, said pattern recognition camera exhibiting a larger field of view and depth of focus than said focus camera, said pattern recognition camera operated by said control means to determine a position of an imaged feature in an X, Y plane orthogonal to said Z axis.

3. The probe system as recited in claim 2 wherein said objective lens means is moved by said control means to enable said focus camera to image both the surface of said DUT and a said probe needle, said control means employing depth of field information obtained from said pattern recognition camera to move said objective lens means to enable precise focusing of said focus camera onto a surface of said DUT and said probe needle.

4. The probe system as recited in claim 3 wherein said objective lens means is a single objective lens assembly exhibiting a fixed magnification characteristic.

5. A probe system for probing a device under test (DUT) comprising:

DUT support means;

a group of probe needles, all said group of probe needles movable as an entity with respect to said DUT support means, and positioned adjacent a surface to be probed of a said DUT and along a Z-axis that extends orthogonally from said surface;

motor means for providing relative movement at least along said Z-axis between said probe needles and said DUT support means;

variable focus imaging means positioned along said z-axis; and control means for causing said variable focus imaging means to provide images of said surface of said DUT and at least a said probe needle of said group of probe needles, said control means responsive to a determined distance between focal planes of said images to cause said motor means to move said group of probe needles and said DUT surface into physical engagement, said motor means controlled to provide a relative movement distance between said group of probe needles and said DUT surface that is greater than said determined distance between said focal planes, thereby creating a predetermined contact pressure between said group of probe needles and said DUT surface.

6. The probe system as recited in claim 5 wherein said variable focus imaging means comprises:

a microscope column including an objective lens means, said objective lens means being movable along said Z-axis;

a focus camera positioned to image light passing through said objective lens; and a pattern recognition camera also positioned to image light passing through said objective lens, said pattern recognition camera exhibiting a larger field of view and depth of focus than said focus camera, said pattern recognition camera operated by said control means to determine a position of an imaged feature in an X, Y plane orthogonal to said Z axis.

7. The probe system as recited in claim 6 wherein said objective lens means is moved by said control means to enable said focus camera to image both the surface of said DUT and a said probe needle, said control means employing depth of field information obtained from said pattern recognition camera to move said objective lens means to enable precise focusing of said focus camera onto a surface of said DUT and said probe needle.

8. The probe system as recited in claim 7 wherein said objective lens means is a single objective lens assembly exhibiting a fixed magnification characteristic.

* * * * *